(12) United States Patent
Müller et al.

(10) Patent No.: US 7,353,449 B2
(45) Date of Patent: Apr. 1, 2008

(54) METHOD OF SOFT-DECISION DECODING OF REED-SOLOMON CODES

(75) Inventors: Stefan Müller, Mönchweiler (DE); Alexander Kravtchenko, Villingen-Schwenningen (DE); Marten Kabutz, Villingen-Schwenningen (DE)

(73) Assignee: Thomson Licensing, Boulogna-Billancourt (FR)

( * ) Notice: Subject to any disclaimer, the term of this patent is extended or adjusted under 35 U.S.C. 154(b) by 28 days.

(21) Appl. No.: 10/513,215

(22) PCT Filed: May 6, 2003

(86) PCT No.: PCT/EP03/04689

§ 371 (c)(1),
(2), (4) Date: Nov. 2, 2004

(87) PCT Pub. No.: WO03/096546

PCT Pub. Date: Nov. 20, 2003

(65) Prior Publication Data

US 2005/0166126 A1      Jul. 28, 2005

(30) Foreign Application Priority Data

May 8, 2002    (EP) .................................. 02010430

(51) Int. Cl.
*H03M 13/00*    (2006.01)
(52) U.S. Cl. ...................................... 714/785; 714/784
(58) Field of Classification Search ............... 714/780, 714/784, 781, 785
See application file for complete search history.

(56) References Cited

U.S. PATENT DOCUMENTS

| | | | |
|---|---|---|---|
| 4,868,828 A | 9/1989 | Shao et al. | |
| 5,280,488 A * | 1/1994 | Glover et al. | 714/784 |
| 5,379,305 A * | 1/1995 | Weng | 714/774 |
| 5,517,509 A | 5/1996 | Yoneda | |
| 5,537,426 A | 7/1996 | Lee | |
| 5,715,262 A * | 2/1998 | Gupta | 714/784 |
| 5,991,911 A | 11/1999 | Zook | |
| 6,032,283 A | 2/2000 | Meyer | |
| 6,304,994 B1 | 10/2001 | Oh et al. | |
| 6,347,389 B1 * | 2/2002 | Boyer | 714/784 |
| 6,449,746 B1 * | 9/2002 | Truong et al. | 714/784 |

(Continued)

FOREIGN PATENT DOCUMENTS

EP        0821493         1/1998

(Continued)

OTHER PUBLICATIONS

Bernard Sklar "Digital Communications, Fundamentals and Applications", Second Edition, Title Page and Table of Contents only.

(Continued)

*Primary Examiner*—Mujtaba Chaudry
(74) *Attorney, Agent, or Firm*—Joseph J. Laks; Paul P. Kiel; Brian J. Dorini

(57) ABSTRACT

The invention relates to a Reed-Solomon decoder and to a method of soft decision decoding of Reed-Solomon codes, wherein a syndrome polynomial, an erasure polynomial, and a modified syndrome polynomial are computed on-the-fly in parallel by iteratively updating coefficients of these polynomials.

10 Claims, 8 Drawing Sheets

U.S. PATENT DOCUMENTS 6,511,280 B1 * 1/2003 Sammartino et al. ....... 414/784
2003/0229841 A1 * 12/2003 Kravtchenko ............... 714/784

FOREIGN PATENT DOCUMENTS

EP 0942421 9/1999

OTHER PUBLICATIONS

Stephen B. Wicker, "Reed-Solomon Codes and Their Applications", IEEE Press, IEEE Communications Society and IEEE Information Theory Society, Title page and Table of Contents only.

Dong-Sun Kim et al., "Implementation of high speed reed-solomon decoder", Proc. of 42nd Midwest Symposium on Circuits and Systems, Aug. 8, 1999, pp. 808-812.

Moon Ho Lee et al., "A high speed Reed-Solomon decoder", Proc. of IEEE Signal Processing Society Workshop, Sakai, Japan, Sep. 16, 1995, pp. 362-367.

Search Report Dated Dec. 1, 2003.

* cited by examiner

METHOD OF SOFT-DECISION DECODING OF REED-SOLOMON CODES

FIELD OF THE INVENTION

This application claims the benefit, under 35 U.S.C. § 365 of International Application PCT/EP03/04689, filed May 6, 2003, which was published in accordance with PCT Article 21(2) on Nov. 20, 2003 in English and which claims the benefit of European patent application No. 02010430.3, filed May 8, 2002.

The present invention pertains generally to error detection/correction and more particularly to systems and methods used in Reed-Solomon decoders.

BACKGROUND AND PRIOR ART

A commonly used error correcting technique is the Reed-Solomon error correcting code. For an overview and for applications of Reed-Solomon codes reference is made to "Reed-Solomon Codes and Their Applications", Stephen B. Wicker, Vijay R. Bhargava, IEEE Press, 1994 and "Digital Communications, Fundamentals and Applications", Second Edition, Bernard Sklar, Prentice Hall PTR, 2001.

U.S. Pat. No. 5,517,509 shows a Reed-Solomon decoder in the form of a Euclid's algorithm operation circuit in which division polynomials are repeatedly divided by residues resulting from the division process of dividend polynomials and division polynomials until the degree of residues of the division process satisfies a prescribed condition.

The Euclid's algorithm operation circuit comprises register groups for storing dividend polynomials and division polynomials, respectively, a feedback loop for storing residues resulting from the division process of the dividend polynomials by the division polynomials, a shifter for shifting contents of registers, and an exchanger for exchanging coefficients of the dividend polynomials with coefficients of the division polynomials.

The decoder comprises a syndrome operator for calculating syndromes from received code-words, an erasure locator generator for generating erasure locator data from erasure locator flags synchronous with received code-words, a modified syndrome generator for generating modified syndromes, an erasure locator polynomial generator for generating erasure locator polynomials from the erasure locator data, a Euclid's algorithm operation circuit for obtaining error locator polynomials and error value polynomials, a Chien searcher for obtaining error locations and error values and a correction processor for correcting errors of the received code-word. The modified syndrome generator and the erasure locator polynomial generator are used jointly with the Euclid's algorithm operation circuit.

Other approaches for implementing a Reed-Solomon decoder are know from U.S. Pat. Nos. 5,991,911, 6,032,283, 6,304,994 B1, 5,537,426 and EP 0 821 493 A1 and EP 0 942 421 A1.

Usually the computation of the modified syndrome polynomial is performed by computation of the product of the syndrome and erasure polynomials. This computation requires additional cycles and computation time to obtain the modified syndrome polynomial.

It is therefore an object of the present invention to provide for a method of soft-decision decoding of Reed-Solomon codes where the calculation of the modified syndrome polynomial does not require additional cycles.

SUMMARY OF THE INVENTION

The object of the invention is solved basically by applying the features laid down in the independent claims. Preferred embodiments of the invention are given in the dependent claims.

The present invention enables to minimize the computation time for soft-decision decoding of Reed-Solomon codes by parallel on-the-fly computation of the syndrome and erasure polynomials as well as the modified syndrome polynomial. In other words, the invention enables to perform the calculation of the modified syndrome polynomial before the computation of the syndrome and erasure polynomials has been completed.

The present invention is particularly advantageous in that it enables to compute the modified syndrome polynomials on-the-fly with the incoming symbols. Therefore a separate computation step usually referred to as polynomial expansion can be omitted.

It is a further advantage that after correction a direct update of the modified syndromes can be performed without computation of the product of the syndrome and erasure polynomials. This results in a reduction of the overall computation time and hardware requirements.

The general idea of the invention is to reduce the number of cycles needed to compute the modified syndrome. To obtain the modified syndrome polynomial a multiplication of the erasure and syndrome polynomial has to be done. The complexity of the conventional serial algorithm for that is $$c = r(l+1) - l(l+1)/2,$$

where r is the number of parity symbols in a RS code word and l is the number of erasures in a code word.

The complexity of the conventional serial-parallel algorithm is $$c = l+1.$$

The general idea of the invention is to compute the modified syndrome on-the-fly. Therefore the present method does not need any additional cycles for computation of the modified syndrome, which saves computation power and time.

DETAILED DESCRIPTION

Figure 1:
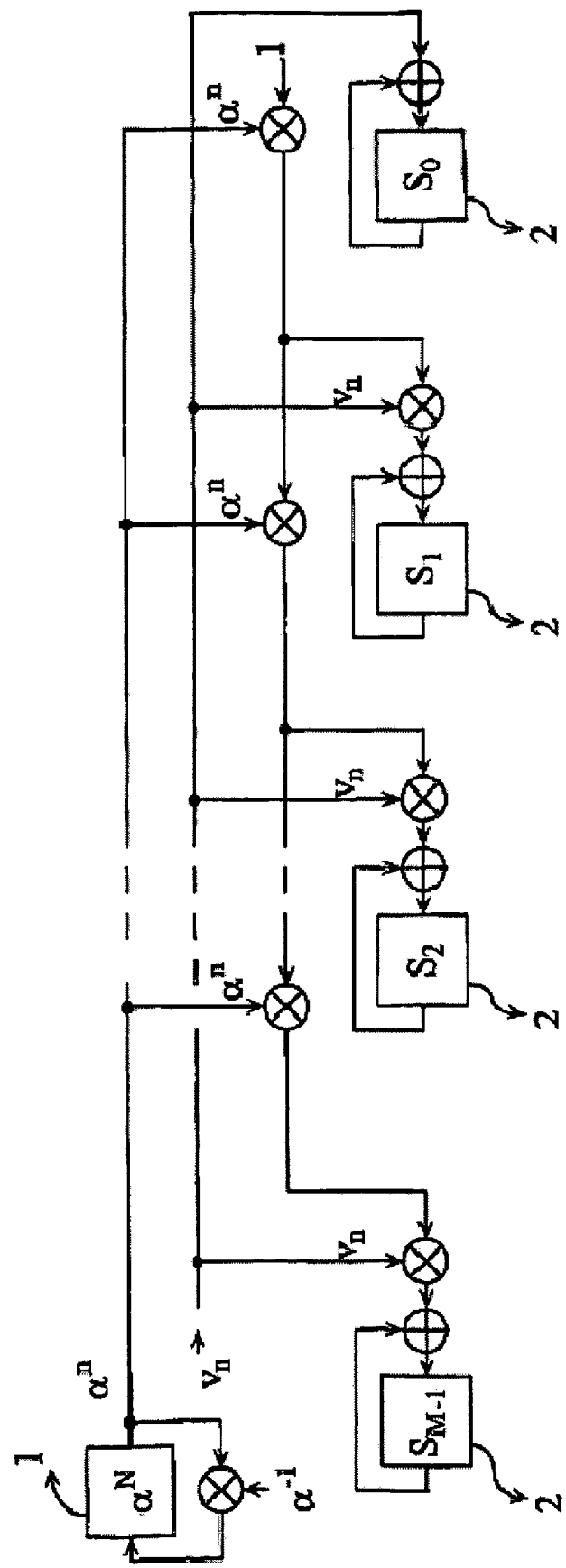
FIG. 1 shows a block diagram of a hardware implementation of a known on-the-fly syndrome computation.

In soft-decision decoding it is known that a receiver can correct as long as $$2e+f<d_{min}. \quad (1)$$

where e is the number of errors, f is the number of erasures, and $d_{min}$ is the Hamming distance.

For Computing the errors the following steps have to be done:

1. Compute the syndrome polynomial $$S(x) = \sum_{i=0}^{N-1} v_i + \sum_{i=0}^{N-1} v_i\alpha^i x + \sum_{i=0}^{N-1} v_i\alpha^{2i} x^2 + \ldots + \sum_{i=0}^{N-1} v_i\alpha^{(M-1)i} x^{M-1} \quad (2)$$

2. Compute the erasure polynomial, where $\alpha^{j_i}$ is the power of the positions $j_0, j_1, \ldots, j_{p-1}$ of the erasures $$\Gamma(x) = \prod_{i=0}^{p-1}(1-\alpha^{j_i} x) \quad (3)$$

3. Construct the modified syndrome polynomial by $$T(x)=\Gamma(x)S(x) \bmod x^M \quad (4)$$

4. Solve the key equation $$\Lambda(x)T(x)=\Omega(x) \bmod x^M \quad (5)$$

with Berlekamp-Massey or Euclid's algorithm.

5. Compute the Forney polynomial $$\Psi(x)=\Lambda(x)\Gamma(x) \quad (6)$$

6. Compute the magnitude of the errors and erasures using the Forney equation.

As apparent from Equations (2) and (3), they can be computed on-the-fly with the incoming data symbols $v_{N-1}, \ldots v_1, v_0$.

In the following a more detailed explanation of an implementation of above step 1, i.e. Equation (2), is given.

Let the error vector be $\vec{e}=[e_0, e_1, \ldots, e_{N-1}]$ with polynomial representation $$e(x)=e_0+e_1 x+\ldots+e_{N-1}x^{N-1} \text{ with } e_i \in GF(2^8). \quad (7)$$

The received polynomial at the input of the decoder is then $$v(x)=c(x)+e(x)=v_0+v_1 x+\ldots+v_{N-1}x^{N-1} \text{ with } v_i \in GF(2^8), \quad (8)$$

where the polynomial coefficients are components of the received vector $\vec{v}$. Since the code word polynomial c(x) is divisible by the generator polynomial g(x), and $g(\alpha^i)=0$ for $i=0,1,\ldots,M-1$, evaluating the polynomial v(x) at the roots of the generator polynomial, which are $\alpha^0, \alpha^1, \ldots \alpha^{M-1}$ yields to $$v(\alpha^j) = c(\alpha^j) + e(\alpha^j) \quad (9)$$

$$= e(\alpha^j)$$

$$= \sum_{i=0}^{N-1} e_i \alpha^{ij}, j = 0, 1, \ldots, M-1.$$

That signifies that the final equation set involves only components of the error pattern not those of the code word. They are called as syndromes $S_j$, $j=0,1,\ldots,M-1$, where $$S_j = v(\alpha^j) = \sum_{i=0}^{N-1} v_i \alpha^{ij}, j = 0, 1, \ldots, M-1. \quad (10)$$

These syndromes are used to form a syndrome polynomial in the form $$S(x) = \sum_{i=0}^{N-1} v_i + \sum_{i=0}^{N-1} v_i\alpha^i x + \sum_{i=0}^{N-1} v_i\alpha^{2i} x^2 + \ldots + \sum_{i=0}^{N-1} v_i\alpha^{(M-1)i} x^{M-1} \quad (11)$$

$$= S_0 + S_1 x + S_2 x^2 + \ldots + S_{M-1} x^{M-1}.$$

An on-the-fly computation of Equation (11) can be achieved is by iteratively updating the coefficients $S_i$, $i=0,1,\ldots,M-1$. At each symbol clock j, a new symbol $v_n$ is arriving, the power $\alpha^n$ of the position n is computed and the coefficients are updated in the following way:

$$S_{i,j}=S_{i,j-1}+v_n\alpha^{in}, i=0,1,\ldots,M-1 \text{ where } S_{i,-1}=0. \quad (12)$$

A hardware implementation of an on-the-fly syndrome computation is shown in FIG. 1. At the beginning of a new code sequence, register 1 is initialised with the power of the position of the first symbol. The registers 2 are initialised with zero. Each time a new symbol arrives, register 1 and registers 2 are clocked, the syndromes are updated according to Equation (12) and the power of the root term in register 1 is decreased by one.

In the following a more detailed explanation of above step 2, i.e. Equation (3), is given.

Assuming p erasures at positions $j_0, j_1, \ldots, j_{p-1}$, the erasure polynomial is computed in the following manner $$\Gamma(x) = \prod_{i=0}^{p-1}(1-\alpha^{j_i} x) \quad (13)$$

$$= \Gamma_0 + \Gamma_1 x + \Gamma_2 x^2 + \ldots + \Gamma_p x^p$$

An on-the-fly computation of that equation can be achieved by iteratively updating the polynomial. Each time j, when a new erasure $v_n$ occurs, the power $\alpha^n$ of the erasure position n is computed and the polynomial is updated in the following way $$\Gamma_j(x)=\Gamma_{j-1}(x)\cdot(1-\alpha^n x)=(\Gamma_{0,j-1}+\Gamma_{1,j-1}x+\ldots+\Gamma_{p,j-1}x^p)(1-\alpha^n x) \quad (14)$$

Examining the final polynomial of Equation (14), the coefficients can be written as $$\Gamma_{i,j} = \begin{cases} \Gamma_{i,j-1} + \alpha^n \Gamma_{i-1,j-1}, & i = 1, 2, \ldots, p \\ 1, & i = 0 \end{cases}, \text{ where } \Gamma_{i,-1} = 0. \quad (15)$$

Figure 2:
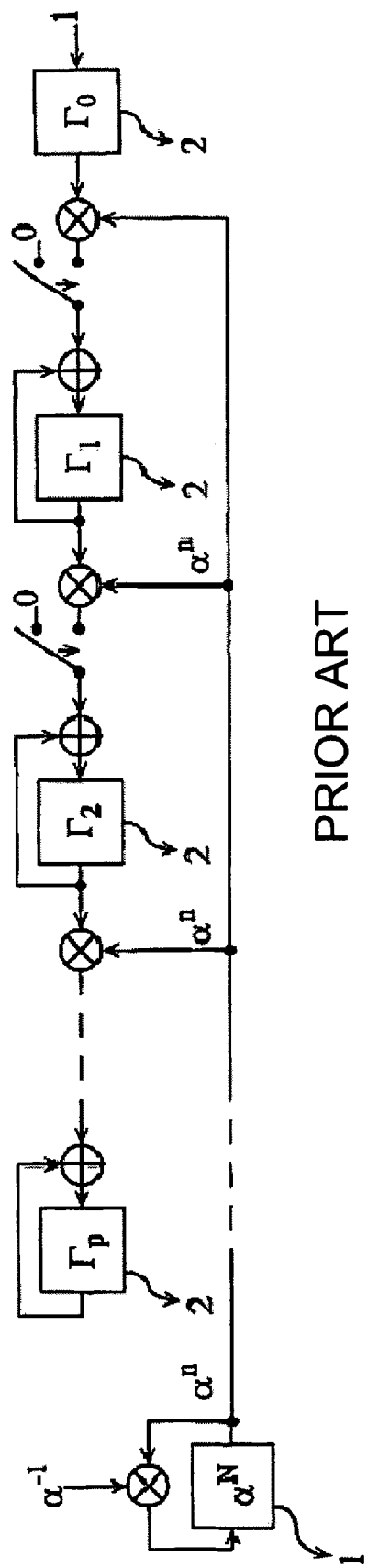
FIG. 2 shows a block diagram of a hardware implementation of a known on-the-fly computation of the erasure polynomial.

A hardware implementation of an on-the-fly erasure polynomial computation, achieved by Equation (15) is depicted in FIG. 2. If the incoming symbol is an erasure, the depicted switches are toggled and the circuit realizes the computation according Equation (15).

The switches remain in their depicted position if the symbol is not an erasure. The switches are realized as combinatorial logic; hence they do not cause any extra clock delay. They are directly connected to the erasure signal provided with the symbol information. At the beginning of a new code sequence register 1 is initialised with the power of the position of the first symbol, for example with $\alpha^{181}$ for the inner code of DVD.

The registers 2 are initialised with zero. Each time, when a new symbol arrives, register 1 and registers 2 are clocked, the syndromes are then updated according to Equation (15) and the power of the root term in register 1 is decreased by one.

The modified syndrome polynomial is obtained by multiplying the syndrome polynomial of Equation (2) with the erasure polynomial of Equation (3), according to $$T(x) = S(x)\Gamma(x) \bmod x^M \quad (16)$$
$$= (S_0 + S_1 x + S_2 x^2 + \ldots + S_{M-1} x^{M-1})$$
$$(\Gamma_0 + \Gamma_1 x + \Gamma_2 x^2 + \ldots + \Gamma_p x^p) \bmod x^M$$

The result is a cyclic convolution between the two polynomials $$T(x) = S_0 \Gamma_0 + (S_1 \Gamma_0 + S_0 \Gamma_1)x + \quad (17)$$
$$(S_2 \Gamma_0 + S_1 \Gamma_1 + S_0 \Gamma_2)x^2 + \ldots + \sum_{j=0}^{M-1} S_j \Gamma_{M-1-j} x^{M-1}$$

According to the present invention, we start by substituting Equation (2) into (17), which yields $$T(x) = \sum_{i=0}^{N-1} v_i + \left(\sum_{i=0}^{N-1} v_i \alpha^i + \sum_{i=0}^{N-1} v_i \Gamma_i\right)x + \quad (18)$$
$$\left(\sum_{i=0}^{N-1} v_i \alpha^{2i} + \sum_{i=0}^{N-1} v_i \alpha^i \Gamma_1 + \sum_{i=0}^{N-1} v_i \Gamma_2\right)x^2 +$$
$$\ldots + \sum_{j=0}^{M-1} \sum_{i=0}^{N-1} v_i \alpha^{ij} \Gamma_{M-1-j} x^{M-1}$$

or better $$T(x) = \sum_{i=0}^{N-1} v_i \left(1 + (\alpha^i + \Gamma_1)x + \quad (19) \right.$$
$$\left. (\alpha^{2i} + \alpha^i \Gamma_1 + \Gamma_2)x^2 + \ldots + \sum_{j=0}^{M-1} \alpha^{ij} \Gamma_{M-1-j} x^{M-1} \right).$$

This equation can now be interpreted in a way that indicates how to update the polynomial coefficients taking previous erasures into account. Assuming that at the time step j−1 the registers $T_i$, i=0,1, . . . M−1 hold the correct modified syndromes and that we receive at time step j a further data symbol, we simply update the modified syndrome polynomial according to Equation (19).

With that information we can write down an algorithm A for an on-the-fly computation of the modified syndromes. Depending on whether the incoming symbol is or is not signaled as an erasure, Algorithm A needs two or one consecutive computations, respectively. But it is also possible to write down an alternative algorithm B for an on-the-fly computation of the modified syndromes. Algorithm B consists of two alternative branches, one of which is selected and performed depending on whether the incoming symbol is or is not signaled as an erasure, and where each of the branches needs just one system clock for performing all the computations necessary for the case in question.

Algorithm A

Figure 3:
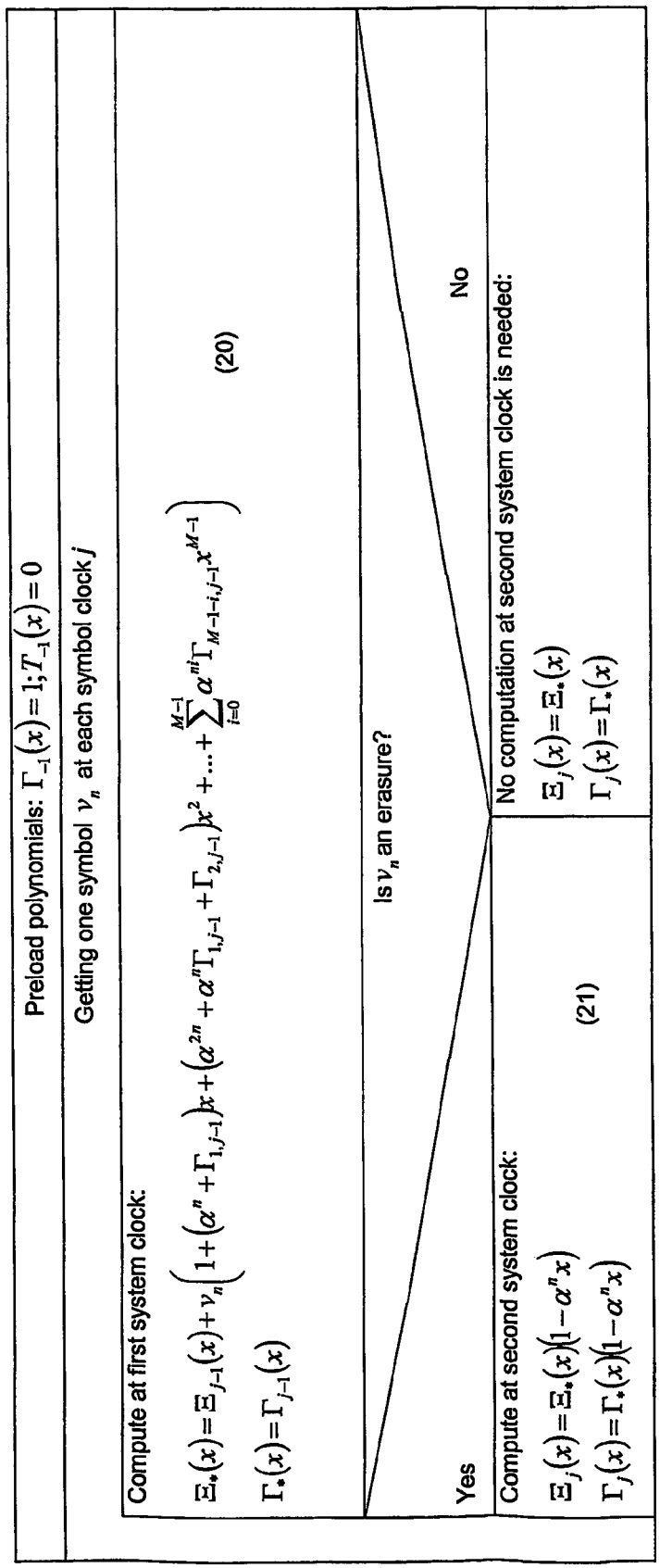
FIG. 3 is illustrative of a flowchart of an embodiment for on-the-fly computation of the modified syndrome polynomial.

With Equation (19) it is possible to compute the modified syndrome directly without the computation of the syndromes. The flowchart in FIG. 3 shows the first embodiment of an on-the-fly computation. The flowchart comprises Equation (20) to calculate two auxiliary terms $T_*(x)$, $\Gamma_*(x)$ and Equation (21) to calculate an iteration result $T_j(x)$, $\Gamma_j(x)$ from the auxiliary terms in case the incoming symbol $v_n$ is an erasure. At each symbol clock, when a new symbol is obtained, the modified syndromes are updated according to Equation (20). At every step of the calculation, the resulting modified syndromes are correct up to the latest received symbol.

For this algorithm the system clock rate has to be at least twice the symbol clock rate. The algorithm ends after the computation for the last symbol, then the correct modified syndrome is obtained.

In case of an erasure two system clocks are needed, one for the updating according to Equation (20) and one for multiplying the polynomial with the root as described by Equation (21). In case of an erasure, the order of computing Equation (20) and (21) can be interchanged. If so, it must be taken care, that if the first symbol of the stream is an erasure, the register $T_0$ must be preloaded with one, otherwise the first part of Equation (21) would yield zero.

The calculation of Equation (20) directly results from the cyclic convolution described in Equation (19). Therefore we describe in the following the algorithm of getting an erasure symbol.

Assume that up to time step n−1 we have in memory the following modified syndrome, which is the linear convolution of Equation (19)

$$T_{n-1}(x) = \sum_{i=0}^{n-1} v_i [1 + (\alpha^i + \Gamma_{1,n-1})x + \quad (22)$$
$$(\alpha^{2i} + \alpha^i \Gamma_{1,n-1} + \Gamma_{2,n-1})x^2 + \ldots +$$
$$\sum_{j=0}^{M-1} \alpha^{ij} \Gamma_{M-1-j,n-1} x^{M-1}]$$

and the erasure polynomial $$\Gamma_{n-1}(x) = 1 + \Gamma_{1,n-1}x + \Gamma_{2,n-1}x^2 + \ldots + \Gamma_{p,n-1}x^p. \quad (23)$$

Next we assume that at time step n an erasure symbol $v_n$, is coming, therefore computation of Equation (20) yields $$T_*(x) = \sum_{i=0}^{n-1} v_i \left(1 + (a^i + \Gamma_{1,n-1})x + (a^{2i} + a^i\Gamma_{1,n-1} + \Gamma_{2,n-1})x^2 + \ldots + \sum_{j=0}^{M-1} a^{ij}\Gamma_{M-1-j,n-1}x^{M-1}\right) + \quad (24)$$
$$v_n\left(1 + (a^n + \Gamma_{1,n-1})x + (a^{2n} + a^n\Gamma_{1,n-1} + \Gamma_{2,n-1})x^2 + \ldots + \sum_{i=0}^{M-1} a^{ni}\Gamma_{M-1-i,n-1}x^{M-1}\right)$$

$$T_*(x) = \sum_{i=0}^{n} v_i \left(1 + (a^i + \Gamma_{1,n-1})x + (a^{2i} + a^i\Gamma_{1,n-1} + \Gamma_{2,n-1})x^2 + \ldots + \sum_{j=0}^{M-1} a^{ij}\Gamma_{M-1-j,n-1}x^{M-1}\right) \quad (25)$$

Now Equation (21) is computed $$T_n(x) = \left(\sum_{i=0}^{n} v_i\left(1 + (a^i + \Gamma_{1,n-1})x + (a^{2i} + a^i\Gamma_{1,n-1} + \Gamma_{2,n-1})x^2 + \right.\right.$$
$$\left.\left. \ldots + \sum_{j=0}^{M-1} a^{ij}\Gamma_{M-1-j,n-1}x^{M-1}\right)\right)(1 - a^n x) \quad (20)$$

Using cyclic convolution again yields $$T_n(x) = \sum_{i=0}^{N} V_l\left(1 + a^i + \frac{a^n + \Gamma_{1,n-1}}{\Gamma_{1,n}}\right)x + \quad (26)$$
$$\left(a^{2i} + \frac{a^i(a^n + \Gamma_{1,n-1})}{\Gamma_{1,n}} + \frac{a^n\Gamma_{1,n-1} + \Gamma_{2,n-1}}{\Gamma_{2,n}}\right)x^2 + \ldots +$$
$$\sum_{j=0}^{M-1} a^{ij}\frac{(a^n\Gamma_{M-1,j,n-1} + \Gamma_{M-1-j,n-1})}{\Gamma_{M-1-j,n}}x^{M-1})$$

which can be rewritten as $$T_n(x) = \quad (27)$$
$$\sum_{i=0}^{n} v_i\left(1 + (a^i + \Gamma_{1,n})x + (a^{2i} + a^i\Gamma_{1,n} + \Gamma_{2,n})x^2 + \ldots + \sum_{j=0}^{M-1} a^{ij}\Gamma_{M-1-j,n}x^{M-1}\right).$$

This is in fact again the linear convolution of the syndrome and erasure polynomial, according to Equation (19).

Figure 4:
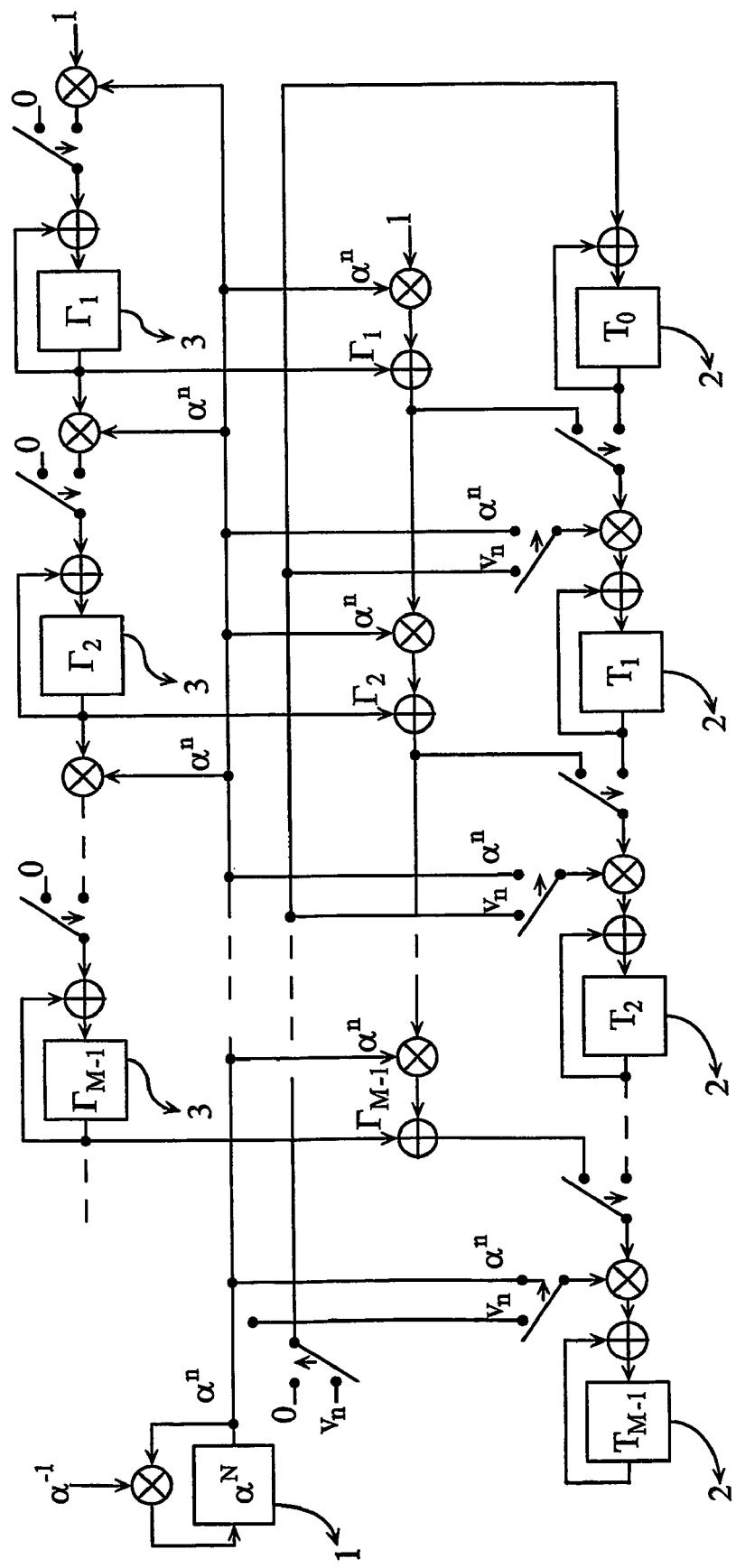
FIG. 4 is a block diagram of a hardware implementation for on-the-fly computation of the modified syndrome polynomials.

An embodiment of algorithm A for on-the-fly computation of the modified syndrome can be seen in FIG. 4. If the switches are in their depicted position, the architecture realizes the computation according to Equation (20). If the switches are toggled, the architecture realizes the computation according to Equation (21).

The switches are realized as combinatorial logic; hence they do not cause any extra clock delay. By comparison with the embodiments of FIG. 1 and FIG. 2 it can easily be seen that there is only an additional adder per cell or register necessary. That means there is a reduction in hardware, because no additional polynomial multiplier is necessary.

At the beginning of a new code sequence, register 1 in FIG. 4 is initialised with the power of the position of the first symbol, for example with $\alpha^{181}$ for the example of the inner code of DVD. The registers 2 and 3 are initialised with zeros. At every rising edge of the symbol clock a new symbol arrives and register 1 is clocked, decreasing the root power by one. Afterwards registers 2 are clocked with the next falling edge of the symbol clock, which updates the syndromes according to Equation (20).

If the arrived symbol was signaled as an erasure, the switches are toggled and registers 2 and 3 are clocked again, computing Equation (21). At the end of the last symbol in the sequence, after the last computation, registers 2 hold the modified syndromes of the whole code sequence and registers 3 hold the erasure polynomial.

In the following reference is made to FIG. 5, which shows an example for the timing behavior of the method of FIG. 3.

Assuming M=10 and order goes downward, as it is the case for the inner code of DVD. The symbol order starts with 181 and goes down to 0. The registers are preloaded with T(x)=0 and $\Gamma_{-1}(x)=1$. Let us assume we receive the following data stream:

$v_{181}=\alpha^6, v_{180}*=\alpha^9, v_{179}*=\alpha^{10}, v_{178}=\alpha^{12}, v_{177}=\alpha^{15},$
$v_{176}=\ldots,\ldots,v_0=\alpha^{\cdot\cdot\cdot};$ where the $v_i*$ shall indicate those symbols which are signaled as erasures. At every rising edge of the symbol clock we get a new symbol $v_n$ together with its erasure information as shown in FIG. 5, and the register 1 of the circuit in FIG. 4 is clocked and contains the right power term $\alpha^n$ of that symbol. At the first system clock after the rising edge of the symbol clock, denoted as 1 in FIG. 5, registers 2 of the circuit in FIG. 4 are clocked in their depicted position and Equation (20) is computed.

Figure 5:
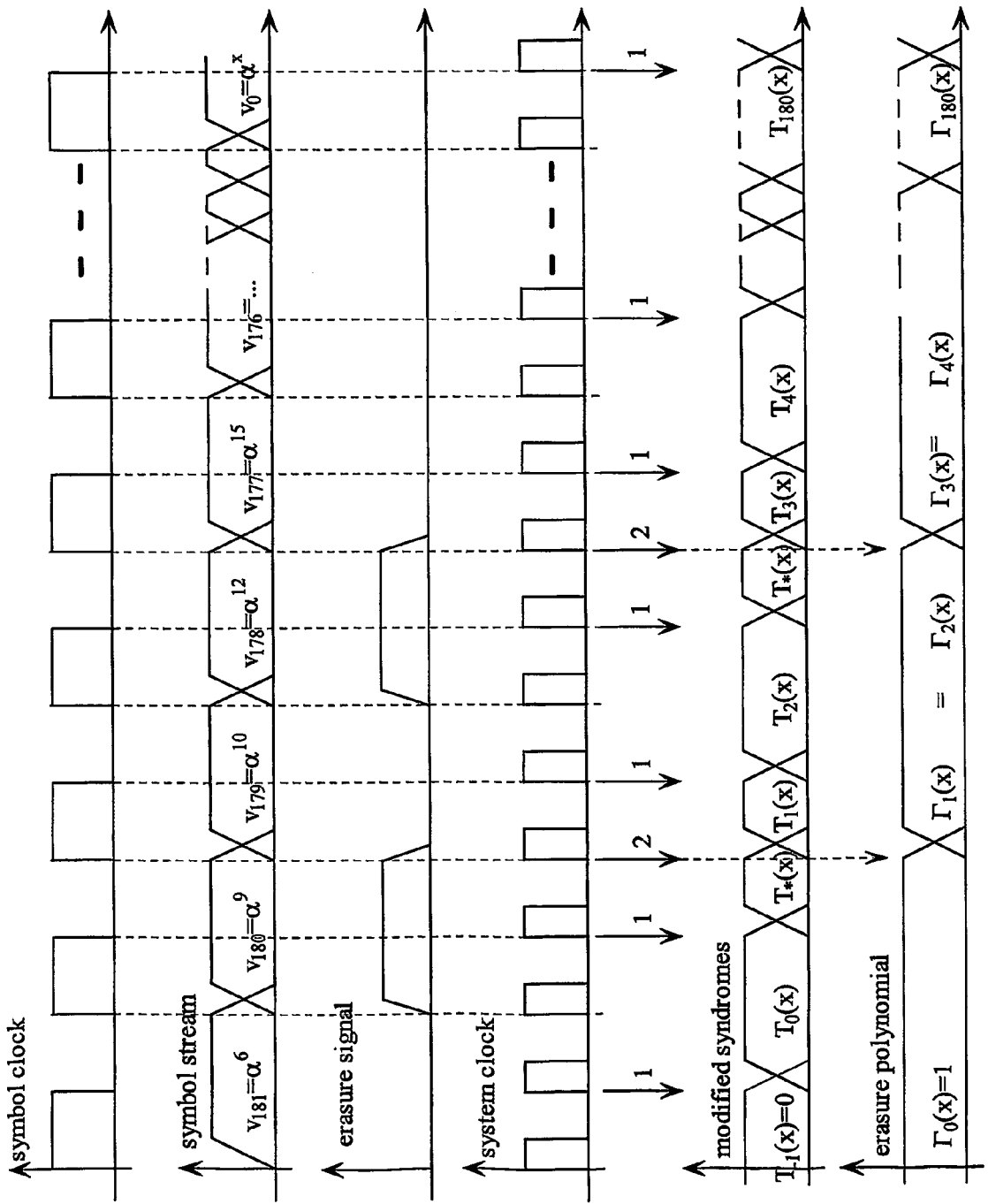
FIG. 5 is a timing diagram, which is related to the flowchart of FIG. 3.

If the erasure signal is true the switches in FIG. 4 are toggled and registers 2 and 3 of the circuit are clocked again at the next rising edge of the system clock, denoted 2 in FIG. 5, which leads to the computation of Equation (21). After the last computation of the 182nd symbol, the correct modified syndrome of the whole codeword is obtained. For the present example, the intermediate results up to after the fifth incoming symbol shall now be explained in detail.

Conventional Way

At first the intermediate modified syndrome is calculated in a conventional way as a reference to be able to verify the result of the inventive algorithm explained below. Equation (2) gives the syndrome of the data stream as $$S(x) = = (a^6 + a^9 + a^{10} + a^{12} + a^{15}) + \qquad (28)$$
$$(a^6 a^{181} + a^9 a^{180} + a^{10} a^{179} + a^{12} a^{178} + a^{15} a^{177})x + \ldots +$$
$$(a^6 a^{9-181} + a^9 a^{9-180} + a^{10} a^{9-179} + a^{12} a^{9-178} + a^{15} a^{9-177})x^9$$
$$= a^{169} + a^{79}x + a^{113}x^2 + a^{37}x^3 + a^{194}x^4 +$$
$$a^{112}x^5 + a^{239}x^6 + a^{168}x^7 + a^{174}x^8 + a^{240}x^9.$$

$$\Gamma(x) = (1 - a^{180}x)(1 - a^{178}x) = 1 + a^{228}x + a^{103}x^2. \qquad (29)$$

By multiplying the two polynomials, the modified syndrome polynomial up to that symbol is obtained as $$T(x) = S(x)\Gamma(x) \bmod x^M = a^{69} + (a^{79} + a^{169}a^{228})x + \qquad (30)$$
$$+ (a^{113} + a^{79}a^{228} + a^{169}a^{103})x^2 + \ldots$$
$$\ldots + (a^{240} + a^{174}a^{228} + a^{168}a^{103})x^9$$
$$= a^{169} + a^{134}x + a^{119}x^2 + a^{68}x^3 + a^{128}x^4 + a^{172}x^5 +$$
$$+ a^{21}x^6 + a^{40}x^7 + a^{217}x^8 + a^{152}x^9$$

On-the-Fly Algorithm

Computation is done in order of the incoming symbol; after each step, the resulting modified syndromes are correct up to the latest received symbol.

1. Getting data symbol $v_{181} = \alpha^6$; first system clock 1; computing Equation (20):

$$T_0(x) = a^6(1 + a^{181}x + a^{2-180}x^2 + \ldots + a^{9-180}x^9) \qquad (31)$$
$$= a^6 + a^{187}x + a^{113}x^2 + a^{39}x^3 + a^{220}x^4 +$$
$$+ a^{146}x^5 + a^{72}x^6 + a^{253}x^7 + a^{179}x^8 + a^{105}x^9$$

$$\Gamma_0 = 1 \qquad (32)$$

2. Getting erasure symbol $v_{180}^* = \alpha^9$; first system clock 1; computing Equation (20):

$$T_*(x) = (a^6 + a^9) + (a^{187} + a^9 a^{180})x + \qquad (33)$$
$$(a^{113} + a^9 a^{2-180})x^2 + \ldots + (a^{105} + a^9 a^{9-180})x^9$$
$$= a^{229} + a^{237}x + a^{138}x^2 + 0 \cdot x^3 + a^{244}x^4 + a^{194}x^5 +$$
$$a^{37}x^6 + a^{94}x^7 + a^{57}x^8 + a^{35}x^9$$

Second system clock 2, computing Equation (21):

$$T_1(x) = a^{229} + (a^{237} + a^{180}a^{229})x + \qquad (34)$$
$$(a^{138} + a^{180}a^{237})x^2 + \ldots + (a^{35} + a^{180}a^{57})x^9$$
$$= a^{229} + a^{211}x + a^{137}x^2 + a^{63}x^3 + a^{244}x^4 + a^{170}x^5 +$$
$$a^{96}x^6 + a^{22}x^7 + a^{203}x^8 + a^{129}x^9$$

and $$\Gamma_1(x) = 1 + a^{180}x \qquad (35)$$

3. Getting data symbol $v_{179} = \alpha^{10}$; first system clock 1, computing Equation (20):

$$T_2(x) = (a^{229} + a^{10}) + (a^{211} + a^{10}(a^{179} + a^{180}))x + \qquad (36)$$
$$(a^{137} + a^{10}(a^{2-179} + a^{179}a^{180}))x^2 + \ldots +$$
$$(a^{129} + a^{10}(a^{9-179} + a^{8-179}a^{180}))x^9$$
$$= a^{199} + a^{179}x + a^{162}x^2 + a^{87}x^3 + a^{209}x^4 + a^{48}x^5 +$$
$$a^{201}x^6 + a^{133}x^7 + a^{182}x^8 + a^{215}x^9$$

$$\Gamma_2(x) = 1 + a^{180}x \qquad (37)$$

4. Getting erasure symbol $v_{178}^* = \alpha^{12}$; first system clock 1, computing Equation (20):

$$T_*(x) = (a^{199} + a^{12}) + (a^{179} + a^{12}(a^{178} + a^{180}))x + \qquad (38)$$
$$(a^{162} + a^{12}(a^{2-178} + a^{178}a^{180}))x^2 + \ldots +$$
$$(a^{215} + a^{12}(a^{9-178} + a^{8-178}a^{180}))x^9$$
$$= a^{216} + a^{110}x + a^{187}x^2 + a^{111}x^3 + a^{17}x^4 + a^{146}x^5 +$$
$$a^{64}x^6 + a^{37}x^7 + a^{108}x^8 + a^{39}x^9$$

Second system clock 2, computing Equation (21):

$$T_3(x) = a^{216} + (a^{110} + a^{178}a^{216})x + \qquad (39)$$
$$(a^{187} + a^{178}a^{110})x^2 + \ldots + (a^{39} + a^{178}a^{108})x^9$$
$$= a^{216} + a^{36}x + a^{234}x^2 + a^{135}x^3 + a^{85}x^4 +$$
$$a^{88}x^5 + a^{202}x^6 + a^{244}x^7 + a^{166}x^8 + a^{231}x^9$$

and $$\Gamma_3(x) = 1 + (a^{180} + a^{178})x + a^{180}a^{178}x^2 \qquad (40)$$
$$= 1 + a^{228}x + a^{103}x^2$$

5. Getting data symbol $v_{177} = \alpha^{15}$; first system clock 1; computing Equation (20):

$$T_4(x) = (a^{216} + a^{15}) + (a^{36} + a^{15}(a^{177} + a^{228}))x + \qquad (41)$$
$$(a^{234} + a^{15}(a^{2-177} + a^{177}a^{228} + a^{103}))x^2 + \ldots +$$
$$(a^{231} + a^{15}(a^{9-177} + a^{8-177}a^{228} + a^{7-177}a^{103}))x^9$$
$$= a^{169} + a^{134}x + a^{119}x^2 + a^{68}x^3 + a^{128}x^4 + a^{172}x^5 +$$
$$a^{21}x^6 + a^{40}x^7 + a^{217}x^8 + a^{152}x^9$$

$$\Gamma_4(x) = 1 + (a^{180} + a^{178})x + a^{180}a^{178}x^2 \qquad (42)$$
$$= 1 + a^{228}x + a^{103}x^2$$

Comparison of Equation (42) with (29) and (41) with (30) verifies the algorithm. This result is an intermediate result, it is not the final modified syndrome but merely the modified syndrome up to the fifth received symbol. The modified syndrome of the whole code sequence is obtained after the 182nd computation.

Algorithm B

In the following, the alternative algorithm B for the computation of the modified syndrome polynomials will be explained in more detail:

The second system clock at the computation of an erasure symbol can be avoided by inserting Equation (20) in Equation (21), which yields $$T_n(x) = T_{n-1}(x)(1 - a^n x) + \\ v_n(1 + (a^n + \Gamma_{1,n-1})x + (a^{2n} + a^n \Gamma_{1,n-1} + \Gamma_{2,n-1})x^2 + \ldots + \\ \sum_{j=0}^{M-1} a^{nj} \Gamma_{M-1-j,n-1} x^{M-1})(1 - a^n x),$$  (43)

or better $$T_n(x) = T_{n-1}(x)(1 - a^n x) + \\ v_n \left( 1 + \underbrace{\left( a^n + \underbrace{a^n + \Gamma_{1,n-1}}_{\Gamma_{1,n}} \right)}_{\Gamma_{1,n-1}} x + \underbrace{\left( a^{2n} + \underbrace{a^n(a^n + \Gamma_{1,n-1})}_{\Gamma_{1,n}} + \underbrace{a^n \Gamma_{1,n-1} + \Gamma_{2,n-1}}_{\Gamma_{2,n}} \right)}_{\Gamma_{2,n-1}} x^2 + \ldots + \\ \sum_{j=0}^{M-1} a^{nj} \underbrace{\underbrace{(a^n \Gamma_{M-j,n-1} + \Gamma_{M-1-j,n-1})}_{\Gamma_{M-1-j,n}} x^{M-1}}_{\Gamma_{M-1,n-1}} .$$  (44)

Therefore the equation can be written as $T_n(x) = T_{n-1}(x)(1-a^n x) + v_n \Gamma_{n-1}(x)$, where $\Gamma_{-1}(x)=1$  (45)

Now it is possible to write down the second algorithm B, which needs only one system clock for every incoming symbol type.

Figure 6:
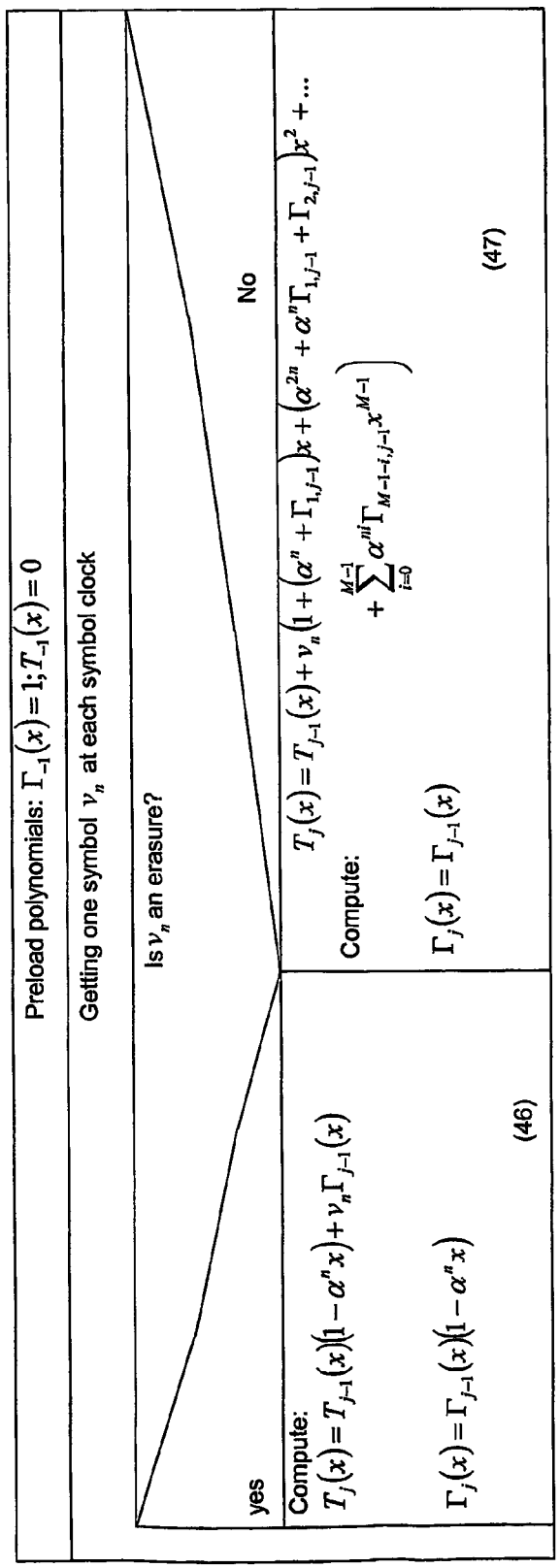
FIG. 6 is illustrative of an alternative method for on-the-fly computation of the modified syndrome polynomials.

The flowchart in FIG. 6 shows the second embodiment of an on-the-fly computation. For calculating one iteration result $T_j(x)$, $\Gamma_j(x)$, the flowchart comprises Equation (46) used in case the incoming symbol $v_n$ is an erasure, and Equation (47) used otherwise.

At each symbol clock, when a new symbol is obtained, the modified syndromes are updated. At every step of the calculation, the resulting modified syndromes are correct up to the latest received symbol. For that algorithm B the system clock rate can be the same as the symbol clock rate, which yields to a very fast computation. The algorithm ends after the last symbol, then the correct modified syndrome is obtained.

Figure 7:
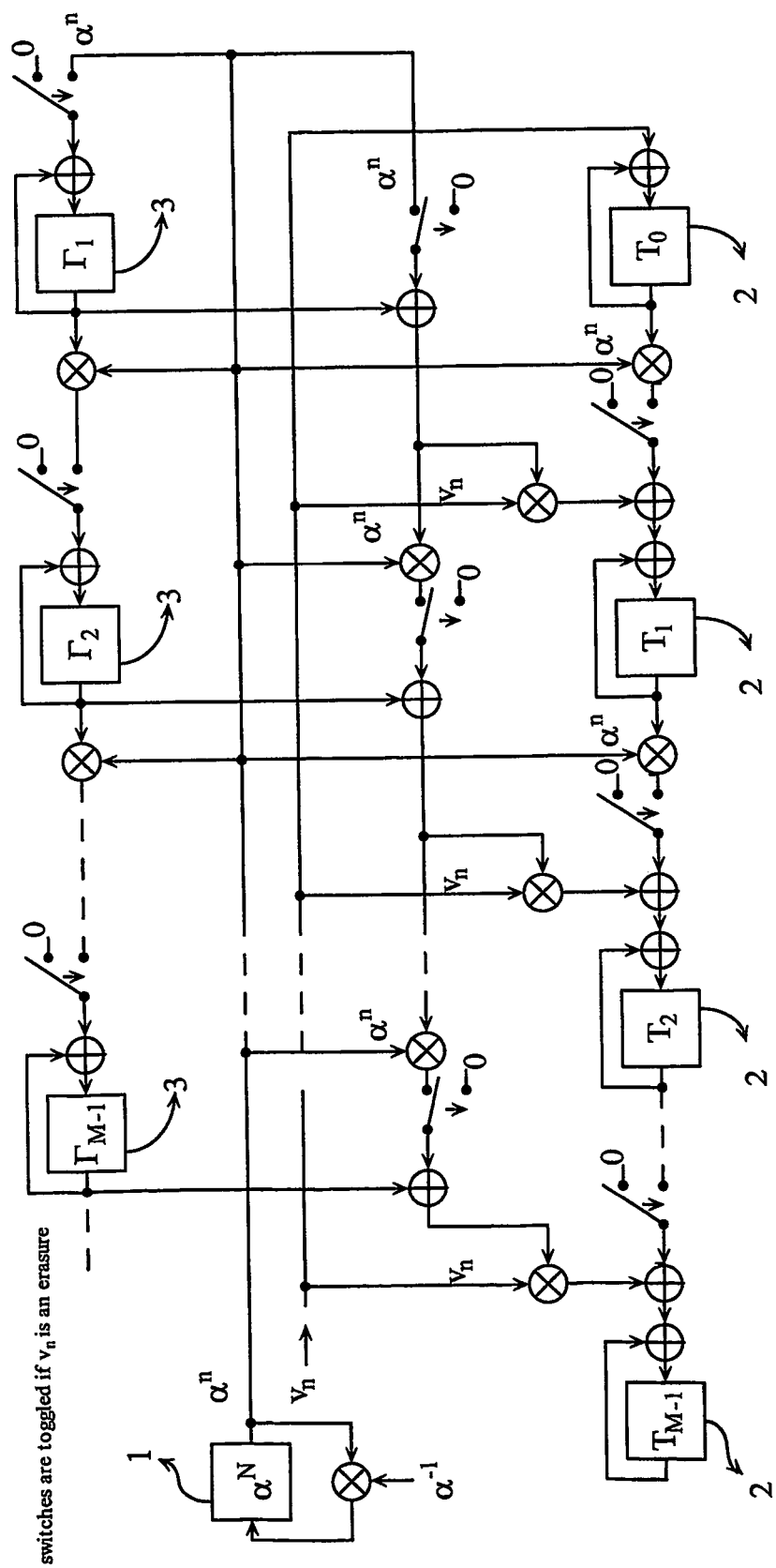
FIG. 7 is a block diagram of a hardware implementation of the method of FIG. 6.

A second embodiment of an on-the-fly computation of the modified syndrome is depicted in FIG. 7. If the switches are in their depicted position, the architecture realizes the computation according to Equation (47). If the switches are toggled, the architecture realizes the computation according to Equation (46).

The switches are realized as combinatorial logic; hence they do not cause any extra clock delay. Comparing the depicted architecture with the one in FIG. 4, an additional multiplier and adder per cell or register is necessary. Increasing the hardware structure and therefore increasing the latency time can achieve reduction of computation time.

At the beginning of a new code sequence, register 1 in FIG. 7 is initialised with the power of the position of the first symbol, for example with $\alpha^{181}$ for the example of the inner code of DVD. The registers 2 and 3 are initialised with zeros. The switches are directly connected to the erasure signal. All registers 1, 2 and 3 are clocked with the rising edge of the symbol clock, which updates the syndromes according to Equation (46) or (47), depending on the erasure signal.

The clocking of register 1 decreases the power of the root term by one, in preparation for the next symbol. At the end of the last symbol in the sequence, after the last computation, registers 2 hold the modified syndromes of the whole code sequence and registers 3 hold the erasure polynomial.

Figure 8:
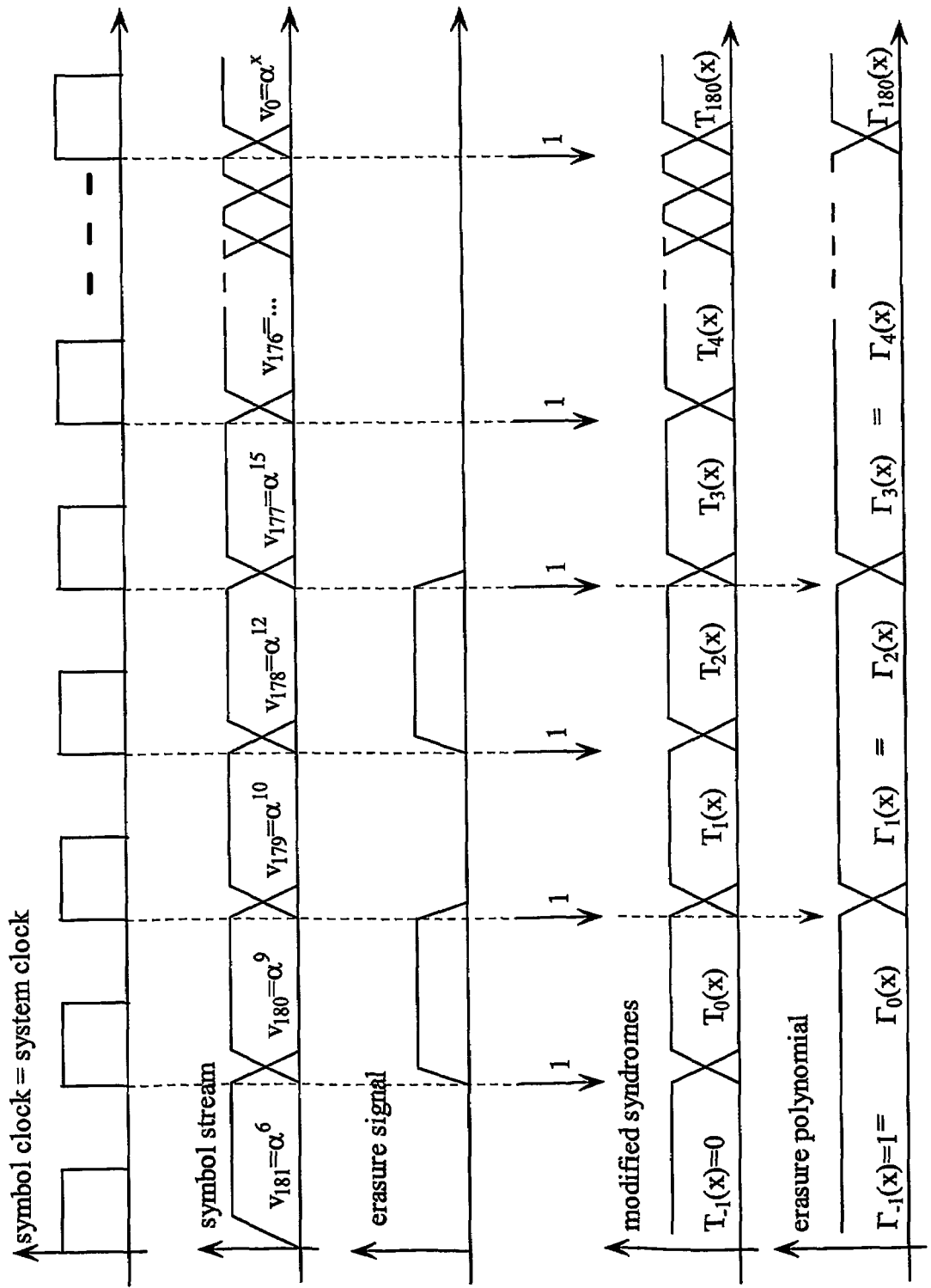
FIG. 8 is a timing diagram relating to the method of FIG. 6.

The timing behavior and the algorithm are now explained by way of example. Assuming M=10 and order goes downward, as it is the case for the inner code of DVD. The symbol order starts with 181 and goes down to 0. The registers are preloaded with $T(x)=0$ and $\Gamma_{-1}(x)=1$. Let us assume we receive the following data stream:

$v_{181}=\alpha^6, v_{180}^*=\alpha^9, v_{179}^*=\alpha^{10}, v_{178}=\alpha^{12}, v_{177}=\alpha^{15},$
$v_{176}=\ldots,\ldots,v_0=\alpha\cdots,$ where the $v_i^*$ shall indicate those symbols-which are signaled as erasures. At every rising edge of the system clock a new symbol $v_n$ and an erasure information as shown in FIG. 8 is obtained.

The erasure signal feeds the switches of the circuit in FIG. 7. If the erasure signal is false the switches remain in their depicted position, if the erasure signal is true the switches are toggled. At the rising edge of the system clock, denoted as 1 in FIG. 6, the circuit in FIG. 7 is clocked and Equation (46) or (47) is computed. After the last, i.e. 182nd symbol clock, the correct modified syndrome of the whole codeword is obtained. For the present example, the intermediate results up to after the fifth incoming symbol shall now be explained in detail.

Computation is done in order of the incoming symbols; after each step, the resulting modified syndromes are correct up to the latest received symbol.

1. Getting data symbol $v_{181}=\alpha^6$; computing Equation (46):

$$T_0(x) = a^6(1 + a^{181}x + a^{2 \cdot 180}x^2 + \ldots + a^{9 \cdot 180}x^9) \\ = a^6 + a^{187}x + a^{113}x^2 + a^{39}x^3 + a^{220}x^4 + \\ a^{146}x^5 + a^{72}x^6 + a^{253}x^7 + a^{179}x^8 + a^{105}x^9$$  (48)

-continued $$\Gamma_0 = 1 \quad (49)$$

2. Getting erasure symbol $v_{180}^* = \alpha^9$ computing Equation (47):

$$T_1(x) = a^6(1 + a^{181}x + a^{2-180}x^2 + \ldots + a^{9-180}x^9) \quad (50)$$
$$= a^6 + (a^{187} + a^{180}a^6)x + (a^{113} + a^{180}a^{187})x^2 + \ldots +$$
$$(a^{105} + a^{180}a^{179})x^9 + a^9$$
$$= a^{229} + a^{211}x + a^{137}x^2 + a^{63}x^3 + a^{244}x^4 + a^{170}x^5 +$$
$$a^{96}x^6 + a^{22}x^7 + a^{203}x^8 + a^{129}x^9$$

and $$\Gamma_1(x) = 1 + a^{180}x \quad (51)$$

3. Getting data symbol $v_{179} = \alpha^{10}$; computing Equation (46):

$$T_2(x) = (a^{229} + a^{10}) + (a^{211} + a^{10}(a^{179} + a^{180}))x + \quad (52)$$
$$(a^{137} + a^{10}(a^{2-179} + a^{179}a^{180}))x^2 + \ldots +$$
$$(a^{129} + a^{10}(a^{9-179} + a^{8-179}a^{180}))x^9$$
$$= a^{199} + a^{179}x + a^{162}x^2 + a^{87}x^3 + a^{209}x^4 +$$
$$a^{48}x^5 + a^{201}x^6 + a^{133}x^7 + a^{182}x^8 + a^{215}x^9$$

$$\Gamma_2(x) = 1 + a^{180}x \quad (53)$$

4. Getting erasure symbol $v_{178}^* = \alpha^{12}$; computing Equation (47):

$$T_3(x) = a^{199} + (a^{179} + a^{178}a^{199})x + \quad (54)$$
$$(a^{162} + a^{178}a^{179})x^2 + \ldots +$$
$$(a^{215} + a^{178}a^{182})x^9 + a^{12} + a^{12}a^{180}x$$
$$= a^{216} + a^{36}x + a^{234}x^2 + a^{135}x^3 + a^{85}x^4$$
$$+ a^{88}x^5 + a^{202}x^6 + a^{244}x^7 + a^{166}x^8 + a^{231}x^9$$

and $$\Gamma_3(x) = 1 + (a^{180} + a^{178})x + a^{180}a^{178}x^2 \quad (55)$$
$$= 1 + a^{228}x + a^{103}x^2$$

5. Getting data symbol $v_{177} = \alpha^{15}$; computing Equation (46):

$$T_4(x) = (a^{216} + a^{15}) + (a^{36} + a^{15}(a^{177} + a^{228}))x + \quad (56)$$
$$(a^{234} + a^{15}(a^{2-177} + a^{177}a^{228} + a^{103}))x^2 +$$
$$(a^{231} + a^{15}(a^{9-177} + a^{8-177}a^{228} + a^{7-177}a^{103}))x^9$$
$$= a^{169} + a^{134}x + a^{119}x^2 + a^{68}x^3 + a^{128}x^4 + a^{172}x^5 +$$
$$a^{21}x^6 + a^{40}x^7 + a^{217}x^8 + a^{152}x^9$$

$$\Gamma_4(x) = 1 + (a^{180} + a^{178})x + a^{180}a^{178}x^2 \quad (57)$$
$$= 1 + a^{228}x + a^{103}x^2$$

Comparison of Equation (56) with (29) and (57) with (30) verifies the algorithm. This result is an intermediate result, it is not the finally modified syndrome, it is the modified syndrome up to that symbol. The modified syndrome of the whole code sequence is obtained after the 182nd computation.

The invention claimed is:

1. A method for soft-decision decoding of Reed-Solomon codewords consisting of N symbols, M of which are check symbols, comprising:

computing a syndrome polynomial, an erasure polynomial, and a modified syndrome polynomial of a same one of the codewords in parallel by iteratively updating coefficients of the syndrome polynomial, the erasure polynomial, and the modified syndrome polynomial at each symbol clock when a new data symbol of the same one of the codewords is arriving, such that the syndrome polynomial, the erasure polynomial, and the modified syndrome polynomial for the same one of the codewords are obtained directly after the coefficient updating for the last symbol of the same one of the codewords has been performed.

2. The method of claim 1 comprising the steps of:
computing the syndrome polynomial S(x) as $$S(x) = \sum_{i=0}^{N-1} v_i + \sum_{i=0}^{N-1} v_i \alpha^i x + \sum_{i=0}^{N-1} v_i \alpha^{2i} x^2 + \ldots + \sum_{i=0}^{N-1} v_i \alpha^{(M-1)i} x^{M-1},$$

where the $v_i$ are the incoming data symbols;
computing the erasure polynomial $\Gamma(x)$ as $$\Gamma(x) = \prod_{i=0}^{p-1} (1 - \alpha^{j_i} x),$$

where $\alpha^{j_i}$ is the power of the positions $j_0, j_1, \ldots, j_{p-1}$ of the erasures and p is the number of erasures in the codeword;
constructing the modified syndrome polynomial in a way which obtains the correct modified syndrome $T(x) = \Gamma(x)S(x) \bmod x^M$ after computation of the last symbol,
determining polynomes $\Lambda(x)$, $\Omega(x)$ by solving the implicit key equation $\Lambda(x)T(x) = \Omega(x) \bmod x^M$ with Berlekamp-Massey or Euclid's algorithm,
computing the Forney polynomial $\Psi(x) = \Lambda(x)\Gamma(x)$
computing the magnitude of the errors and erasures using the Forney equation.

3. The method of claim 2, whereby the computation of the erasure polynomial and the modified syndrome polynomial is performed on-the-fly with the incoming data symbols $v_{N-1}, \ldots, v_1, v_0$.

4. The method of claim 1, whereby the syndrome polynomial is computed in the form $$S(x) = \sum_{i=0}^{N-1} v_i + \sum_{i=0}^{N-1} v_i \alpha^i x + \sum_{i=0}^{N-1} v_i \alpha^{2i} x^2 + \ldots + \sum_{i=0}^{N-1} v_i \alpha^{(M-1)i} x^{M-1}$$
$$= S_0 + S_1 x + S_2 x^2 + \ldots + S_{M-1} x^{M-1}.$$

by iteratively updating the coefficients $S_i$, $i = 0, 1, \ldots, M-1$, whereby at each symbol clock j when a new symbol $v_n$ is arriving, the power $\alpha^n$ of the position n is computed and the coefficients are updated in the following way $$S_{i,j}=S_{i,j-1}+v_n\alpha^{in}, i=0,1, \ldots, M-1 \text{ where } S_{i-1}=0.$$

5. The method of claim 1, whereby the erasure polynomial is computed on-the-fly by iteratively updating the polynomial $$\Gamma(x) = \prod_{i=0}^{p-1}(1 - \alpha^{j_i}x)$$
$$= \Gamma_0 + \Gamma_1 x + \Gamma_2 x^2 + \ldots + \Gamma_p x^p$$

whereby the updating is performed at each symbol clock $j_i$ when a new arriving symbol is being flagged as an erasure, the power $\alpha^{j_i}$ of the erasure position $j_i$ is computed and the polynomial is updated in the following way $$\Gamma_j(x)=\Gamma_{j-1}(x)\cdot(1-\alpha^{j_i}x)=(\Gamma_{0,j-1}+\Gamma_{1,j-1}x+\ldots+\Gamma_{p,j-1}x^p)(1-\alpha^{j_i}x).$$

6. The method of claim 1, the on-the-fly computation of the modified syndrome polynomial being performed by the steps of:
preloading of polynomials $\Gamma_{-1}(x)=1; T_{-1}(x)=0$;
getting one symbol $v_n$ at each symbol clock;
computing at a first system clock within the symbol clock:

$$T_*(x) = T_{j-1}(x) + v_n\left(1 + (\alpha^n + \Gamma_{1,j-1})x + (\alpha^{2n} + \alpha^n\Gamma_{1,j-1} + \Gamma_{2,j-1})x^2 + \ldots + \sum_{i=0}^{M-1}\alpha^{ni}\Gamma_{M-1-i,j-1}x^{M-1}\right)$$

$$\Gamma_*(x) = \Gamma_{j-1}(x)$$

determining if $v_n$ is an erasure;
if yes: computing at a second system clock within the symbol clock:

$$T_j(x)=T(x)(1-\alpha^n x);$$
$$\Gamma_j(x)=\Gamma_{j-1}(x)(1-\alpha^n x)$$

if no: using $$T_j(x)=T_*(x)$$
$$\Gamma_j(x)=\Gamma_*(x).$$

7. The method of claim 1, the computation of the modified syndrome polynomial involving, in cases where an incoming symbol is flagged as an erasure, an on-the-fly updating step in the form:

$$T_n(x)=T_{n-1}(x)(1-\alpha^n x)+v_n\Gamma_{n-1}(x), \text{ where } \Gamma_{-(x)}=1.$$

8. The method of claim 1, the modified syndrome polynomial being computed on-the-fly by the steps of:
preloading of polynomials $\Gamma_{-1}(x)=1; T_{-1}(x)=0$,
getting one symbol $v_n$ at each symbol clock,
determining if $v_n$ is an erasure,
if Yes: Computing $$T_j(x)=T_{j-1}(x)(1-\alpha^n x)+v_n\Gamma_{j-1}(x)$$
$$\Gamma_j(x)=\Gamma_{j-1}(x)(1-\alpha^n x);$$

if No: computing $$T_j(x) = T_{j-1}(x) + v_n\left(1 + (\alpha^n + \Gamma_{1,j-1})x + (\alpha^{2n} + \alpha^n\Gamma_{1,j-1} + \Gamma_{2,j-1})x^2 + \ldots + \sum_{i=0}^{M-1}\alpha^{ni}\Gamma_{M-1-i,j-1}x^{M-1}\right)$$

$$\Gamma_j(x) = \Gamma_{j-1}(x).$$

9. A digital storage medium comprising: a program for soft-decision decoding of Reed-Solomon codewords, the program being adapted for computing a syndrome polynomial, an erasure polynomial, and a modified syndrome polynomial of a same one of the codewords in parallel by iteratively updating coefficients of the syndrome polynomial, the erasure polynomial, and the modified syndrome polynomial at each symbol clock when a new data symbol of the same one of the codewords is arriving, such that the syndrome polynomial, the erasure polynomial, and the modified syndrome polynomial for the same one of the codewords are obtained directly after the coefficient updating for the last symbol of the same one of the codewords has been performed.

10. An apparatus comprising: a Reed-Solomon codeword decoder configured for computation of a syndrome polynomial, an erasure polynomial, and a modified syndrome polynomial of a codeword in parallel by iteratively updating coefficients of the syndrome polynomial, the erasure polynomial and the modified syndrome polynomial of the codeword at each symbol clock when a new data symbol of the codeword is arriving, such that the syndrome polynomial, the erasure polynomial and the modified syndrome polynomial for the codeword are obtained directly after the coefficient updating for the last symbol of the codeword has been performed.

* * * * *